(12) United States Patent
Haub et al.

(10) Patent No.: US 9,143,246 B2
(45) Date of Patent: *Sep. 22, 2015

(54) DETECTION AND MITIGATION OF INTERFERENCE IN A RECEIVER

(71) Applicant: Spreadtrum Communications USA Inc., San Diego, CA (US)

(72) Inventors: David Haub, San Diego, CA (US); Zhigang Xu, San Diego, CA (US); Jarrett Malone, Carlsbad, CA (US)

(73) Assignee: Spreadtrum Communications USA Inc., San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/336,447

(22) Filed: Jul. 21, 2014

(65) Prior Publication Data

US 2014/0329480 A1 Nov. 6, 2014

Related U.S. Application Data

(62) Division of application No. 13/190,161, filed on Jul. 25, 2011, now Pat. No. 8,787,507.

(51) Int. Cl.
| | |
|---|---|
| *H04B 17/00* | (2015.01) |
| *H04B 1/10* | (2006.01) |
| *H03G 3/30* | (2006.01) |
| *H04L 25/03* | (2006.01) |
| *H04B 1/12* | (2006.01) |
| *H04B 17/29* | (2015.01) |
| *H04B 17/327* | (2015.01) |

(52) U.S. Cl.
CPC ............ *H04B 17/008* (2013.01); *H03G 3/3078* (2013.01); *H04B 1/1027* (2013.01); *H04B 1/123* (2013.01); *H04B 17/29* (2015.01); *H04B 17/327* (2015.01); *H04L 25/03057* (2013.01)

(58) Field of Classification Search
CPC .................................................... H04B 7/0632
USPC ........................................................ 455/226
See application file for complete search history.

(56) References Cited

U.S. PATENT DOCUMENTS

| | | | | |
|---|---|---|---|---|
| 5,095,534 | A  * | 3/1992 | Hiyama | 455/266 |
| 8,417,202 | B1 * | 4/2013 | Fong et al. | 455/136 |
| 8,494,469 | B2 * | 7/2013 | Haub et al. | 455/245.2 |

* cited by examiner

*Primary Examiner* — Lihong Yu
(74) *Attorney, Agent, or Firm* — Ballard Spahr LLP

(57) ABSTRACT

A receiver architecture optimizes receiver performance in the presence of interference. In various embodiments, power estimation circuits are used with variable selectivity to determine the exact nature of the interference and to optimize the performance correspondingly. The variable selectivity is achieved using stages of filtering with progressively narrower bandwidths. Also, the actual method of optimizing the receiver performance is an improvement compared to the traditional techniques in that the gain settings and the baseband filter order (stages to be used) will be optimized based on the nature of the interference as determined by the power detector measurements. For a device such as a cellular phone that operates in a dynamic and changing environment where interference is variable, embodiments advantageously provide the capability to modify the receiver's operational state depending on the interference.

17 Claims, 7 Drawing Sheets

DETECTION AND MITIGATION OF INTERFERENCE IN A RECEIVER

RELATED APPLICATION

The present application is a divisional of U.S. patent application Ser. No. 13/190,161 titled "Detection and Mitigation of Interference in a Receiver" filed Jul. 25, 2011, now U.S. Pat. No. 8,787,507, the entirety of which is incorporated by reference herein.

FIELD

The present disclosure relates to receiver architectures in a communications system, and more particularly, some embodiments relate to methods and apparatuses for detecting and mitigating interference and optimizing receiver performance.

BACKGROUND

Radio frequency transceivers in cellular systems commonly receive and decode a desired signal in the presence of interference, which has commonly required a compromise in receiver performance. For example, in order to prevent clipping due to interference, several stages of narrow analog filters are typically found in conventional receiver designs. Such filters add current drain and distort the desired signal, thus degrading receiver performance. Additionally, the active stages of the receiver, particularly the radio frequency (RF) stages, are designed with high levels of linearity so that distortion is minimized in the presence of interference. This linearity often requires relatively high bias conditions and therefore requires relatively high current drain.

A typical prior art receiver architecture is shown in FIG. 1. This architecture represents a typical receiver implementation and is described in U.S. Pat. No. 6,498,926 to Ciccarelli et al. Within receiver 100, the transmitted RF signal is received by antenna 112, routed through duplexer 114, and provided to low noise amplifier (LNA) 116, which amplifies the RF signal and provides the signal to bandpass filter 118. Bandpass filter 118 filters the signal to remove some of the spurious signals which can cause intermodulation products in the subsequent stages. The filtered signal is provided to mixer 120, which downconverts the signal to an intermediate frequency (IF) with a sinusoidal signal from local oscillator 122. The IF signal is provided to bandpass filter 124, which filters spurious signals and downconversion products prior to the subsequent downconversion stage. The filtered IF signal is provided to variable gain amplifier (VGA) 126, which amplifies the signal with a variable gain to provide an IF signal at the required amplitude. The gain is controlled by a control signal from gain control circuit 128. The IF signal is provided to demodulator 130, which demodulates the signal in accordance with the modulation format used at the transmitter (not shown).

For this prior art architecture, the local oscillator signal (LO) is either tuned to match the radio frequency signal (RF), so that the received signal is converted directly to baseband, or it is tuned to convert the received RF signal to some much lower intermediate frequency (IF) for further filtering. At baseband or IF, the filters are set to the bandwidth of the particular RF system to receive the desired signal and remove interference.

The architecture in FIG. 1 is designed to receive the desired signal in the presence of interference. The filter at baseband or IF is set to remove completely any interference, and the RF stage gain and bias are set to receive the signal with interference with minimal distortion. Thus, such a conventional system makes assumptions about the presence of interference, which may reduce interference at the expense of receiver performance when the expected interference is present, but which may constitute a wasteful approach when such assumptions are incorrect.

Another prior art receiver architecture is disclosed at FIG. 2 of U.S. Pat. No. 6,498,926 to Ciccarelli et al. In this prior art architecture, post-demodulation quality is used to set the bias conditions and therefore the linearity of the RF circuits. This prior art approach does not address the problem fully because the receiver state is adjusted based only on the baseband data quality measurement, which might be degraded for numerous reasons and not just due to interference and/or reduced RF linearity. Also, this architecture does not do anything to reduce the filtering requirement to match the actual interference conditions.

Another prior art receiver architecture is disclosed at U.S. Pat. No. 6,670,901 to Brueske et al. This prior art architecture includes an on-channel power detector, a wide band power detector, and an off-channel power detector. The wideband detector and off-channel detector will indicate if high levels of interference are present and allow adjustment of the receiver bias based on that. This prior art architecture suggests using the information from these power detectors to adjust the dynamic range of several blocks (LNA, mixer, filter, analog-to-digital (A/D) converter, and digital filter). By adjusting the dynamic range and/or bias of these stages, the current drain can be optimized. However, this prior art approach uses wideband detection without selectivity and therefore is unable to distinguish out-of-band interference, i.e., interference that is several channels away, from nearby interference in the adjacent or nearby channels. Therefore, the architecture cannot fully optimize the performance of the receiver.

Since an actual device such as a cellular phone operates in a dynamic and changing environment where interference is variable, it is desirable to be able to modify the receiver's operational state depending on the interference.

SUMMARY

In some embodiments of the present disclosure, an apparatus includes a first amplifier configured to amplify an input signal. A mixer is coupled to the first amplifier. The mixer is configured to mix the amplified input signal outputted by the first amplifier with an oscillator signal, to provide a mixed signal. A first estimation circuit is configured to measure voltage or power of the mixed signal. A first filter is configured to filter the mixed signal to pass a first band of frequencies. A second amplifier is configured to amplify an output of the first filter. A second estimation circuit is configured to measure voltage or power at an output of the second amplifier. A second filter is configured to filter the output of the second amplifier to pass a second band of frequencies narrower than the first band. The first and second filters may be baseband filters. A state machine is coupled to the first and second estimation circuits. The state machine is configured to provide feedback to the first and second amplifiers and to the mixer. The state machine is configured to increase a bias current of the first amplifier and/or the mixer, or decrease a gain of the first amplifier and/or the mixer, or both increase the bias current and decrease the gain, when the voltage or power measured by the first estimation circuit is greater than a first predetermined threshold and the voltage or power measured by the second estimation circuit is less than a second predetermined threshold. The state machine is further configured to decrease a gain of the first amplifier, the second amplifier, and/or the mixer when the voltage or power measured by the second estimation circuit is greater than the second predetermined threshold. The apparatus may include a third estimation circuit, configured to measure the voltage or power at an output of the second filter, and a third filter, which may be a baseband filter, and which may be configured to filter the output of the second filter to pass a third band of frequencies narrower than the second band. The state machine may be further coupled to the third estimation circuit and may be further configured to provide feedback to the third filter and to bypass the third filter when the voltage or power measured by the third estimation circuit is less than a third predetermined threshold.

In some embodiments of the present disclosure, an apparatus includes a first amplifier configured to amplify an input signal. A mixer is coupled to the first amplifier. The mixer is configured to mix the amplified input signal outputted by the first amplifier with an oscillator signal, to provide a mixed signal. A first estimation circuit is configured to measure voltage or power of the mixed signal. A first filter is configured to filter the mixed signal to pass a first band of frequencies. A second amplifier is configured to amplify an output of the first filter. A second estimation circuit is configured to measure voltage or power at an output of the second amplifier. A second filter is configured to filter the output of the second amplifier to pass a second band of frequencies narrower than the first band. A third estimation circuit is configured to measure the voltage or power at an output of the second filter. A third filter is configured to filter the output of the second filter to pass a third band of frequencies narrower than the second band. The first, second, and third filters may be baseband filters. A state machine is coupled to the first, second, and third estimation circuits. The state machine is configured to provide feedback to the first and second amplifiers, to the first, second, and third filters, and to the mixer. The state machine is configured to bypass the third filter when the voltage or power measured by the third estimation circuit is less than a predetermined threshold.

In some embodiments, an input signal is amplified to provide an amplified input signal, which is mixed with an oscillator signal to provide a mixed signal. The voltage or power of the mixed signal is measured. The mixed signal is filtered at a first filter to pass a first band of frequencies, to provide a first filtered signal, which is amplified to provide a first amplified signal. The voltage or power of the first amplified signal is measured. The first amplified signal is filtered at a second filter to pass a second band of frequencies narrower than the first band, to provide a second filtered signal. If the measured voltage or power of the mixed signal is greater than a predetermined threshold T1 and the measurement at Pdet2 is less than a predetermined threshold T2, then a bias current used for the amplifying the input signal, and/or for the mixing may be increased. If the measured voltage or power of the first amplified signal is greater than the predetermined threshold T2, then a gain used for at least one of the amplifying the first filtered signal, the amplifying the input signal, and amplifying the mixed signal may be decreased. The voltage or power of the second filtered signal may be measured. A third filter may be provided to filter the second filtered signal, to pass a third band of frequencies narrower than the second band, and to provide a third filtered signal. If the measured voltage or power of the second filtered signal is less than a predetermined threshold T3, then the third filter may be bypassed.

In some embodiments, an input signal is amplified to provide an amplified input signal, which is mixed with an oscillator signal to provide a mixed signal. The voltage or power of the mixed signal is measured. The mixed signal is filtered, at a first filter, to pass a first band of frequencies, to provide a first filtered signal, which is amplified to provide a first amplified signal. The voltage or power of the first amplified signal is measured. The first amplified signal is filtered, at a second filter, to pass a second band of frequencies narrower than the first band, to provide a second filtered signal. If the measured voltage or power of the mixed signal is greater than a predetermined threshold T1 and the measurement at Pdet2 is less than a predetermined threshold T2, then a gain used for the amplifying the input signal and/or the mixing may be decreased. If the measured voltage or power of the first amplified signal is greater than the predetermined threshold T2, then a gain used for at least one of the amplifying the first filtered signal, the amplifying the input signal, and amplifying the mixed signal may be decreased. The voltage or power of the second filtered signal may be measured. A third filter may be provided to filter the second filtered signal, to pass a third band of frequencies narrower than the second band, and to provide a third filtered signal. If the measured voltage or power of the second filtered signal is less than a predetermined threshold T3, then the third filter may be bypassed.

In some embodiments, an input signal is amplified to provide an amplified input signal, which is mixed with an oscillator signal to provide a mixed signal. The voltage or power of the mixed signal is measured. The mixed signal is filtered, at a first filter, to pass a first band of frequencies, to provide a first filtered signal, which is amplified to provide a first amplified signal. The voltage or power of the first amplified signal is measured. The first amplified signal is filtered, at a second filter, to pass a second band of frequencies narrower than the first band, to provide a second filtered signal. The voltage or power of the second filtered signal may be measured. A third filter may be provided to filter the second filtered signal, to pass a third band of frequencies narrower than the second band, and to provide a third filtered signal. If the measured voltage or power of the second filtered signal is less than a predetermined threshold, then the third filter may be bypassed.

In some embodiments, an apparatus includes first and second receiver modules in a multiple input multiple output (MIMO) communications system, first and second estimation circuits, and a state machine. The first and second receiver modules are configured to process a first input signal and a second input signal, respectively Each receiver module includes a first amplifier configured to amplify the corresponding input signal, and a mixer coupled to the first amplifier, with the mixer configured to mix the amplified input signal outputted by the first amplifier with an oscillator signal, to provide a mixed signal. Each receiver module also includes a first filter configured to filter the mixed signal to pass a first band of frequencies, a second amplifier configured to amplify an output of the first filter, and a second filter configured to filter the output of the second amplifier to pass a second band of frequencies narrower than the first band. The first estimation circuit is configured to measure voltage or power of the mixed signal of the first receiver module. The second estimation circuit is configured to measure voltage or power at an output of the second amplifier of the first receiver module. The state machine is coupled to the first and second estimation circuits. The state machine is configured to provide feedback to the first and second amplifiers of the second receiver module and to the mixer of the second receiver module. The state machine is configured to increase a bias current of at least one of the first amplifier of the second receiver module and the mixer of the second receiver module, or decrease a gain of at least one of the first amplifier of the second receiver module and the mixer of the second receiver module, or both increase the bias current and decrease the gain, when the voltage or power measured by the first estimation circuit is greater than a first predetermined threshold and the voltage or power measured by the second estimation circuit is less than a second predetermined threshold. The state machine is further configured to decrease a gain of at least one of the first amplifier of the second receiver module, the second amplifier of the second receiver module, and the mixer of the second receiver module when the voltage or power measured by the second estimation circuit is greater than the second predetermined threshold. The apparatus may include a third estimation circuit configured to measure voltage or power at an output of the second filter of the first receiver module. Each receiver module may includes a third filter configured to filter the output of the second filter of that receiver module to pass a third band of frequencies narrower than the second band. The state machine may be further coupled to the third estimation circuit, and may be further configured to provide feedback to the third filter of the second receiver module. The state machine may be further configured to bypass the third filter of the second receiver module when the voltage or power measured by the third estimation circuit is less than a third predetermined threshold.

BRIEF DESCRIPTION OF THE DRAWINGS

The following will be apparent from elements of the figures, which are provided for illustrative purposes and are not necessarily to scale.

DETAILED DESCRIPTION

This description of the exemplary embodiments is intended to be read in connection with the accompanying drawings, which are to be considered part of the entire written description.

Embodiments of the present disclosure provide a receiver architecture to optimize receiver performance in the presence of interference. In various embodiments, estimation circuits are used with variable selectivity to determine the exact nature of the interference and to optimize the performance correspondingly. The variable selectivity is achieved using stages of filtering with progressively narrower bandwidths. Also, the actual method of optimizing the receiver performance is an improvement compared to the prior art in that the gain settings and the baseband filter order (stages to be used) will be optimized based on the nature of the interference as determined by the measurements from the estimation circuits.

Figure 1:
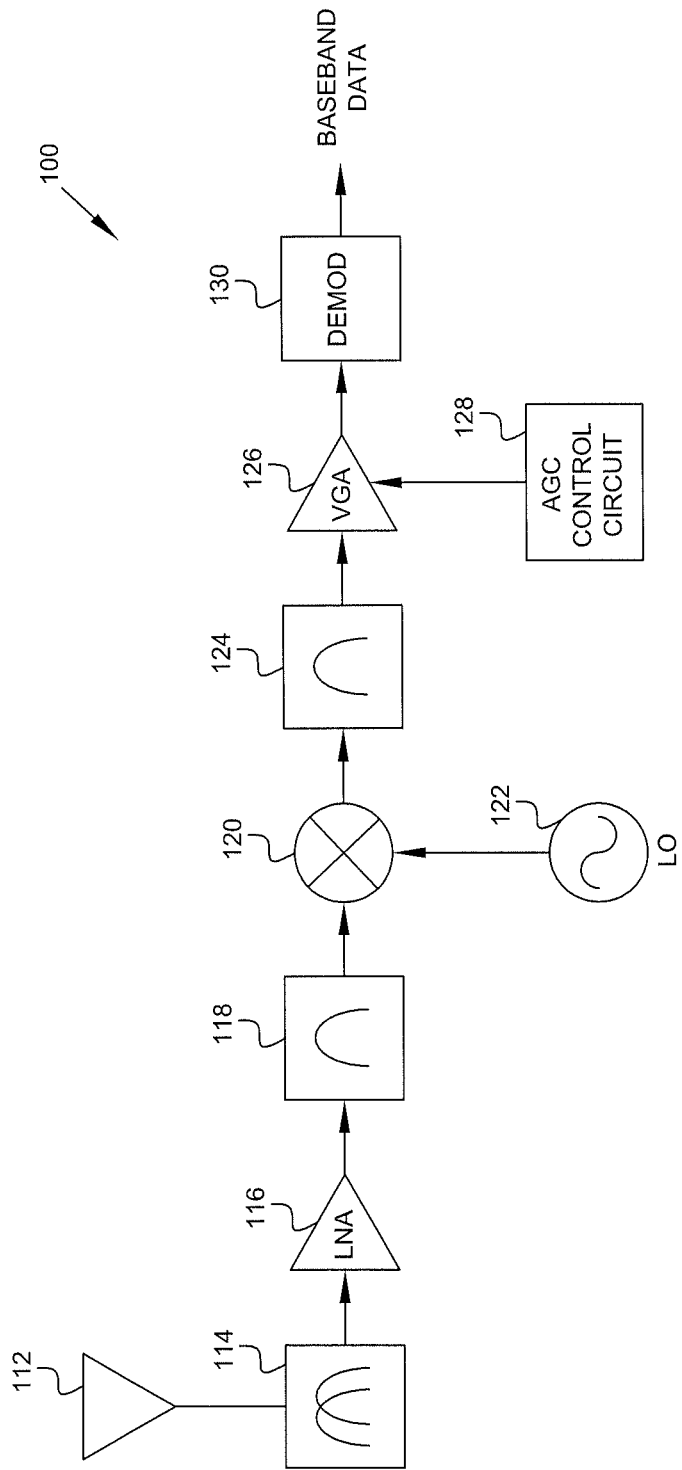
FIG. 1 is a block diagram of a receiver architecture known in the prior art.
Figure 2:
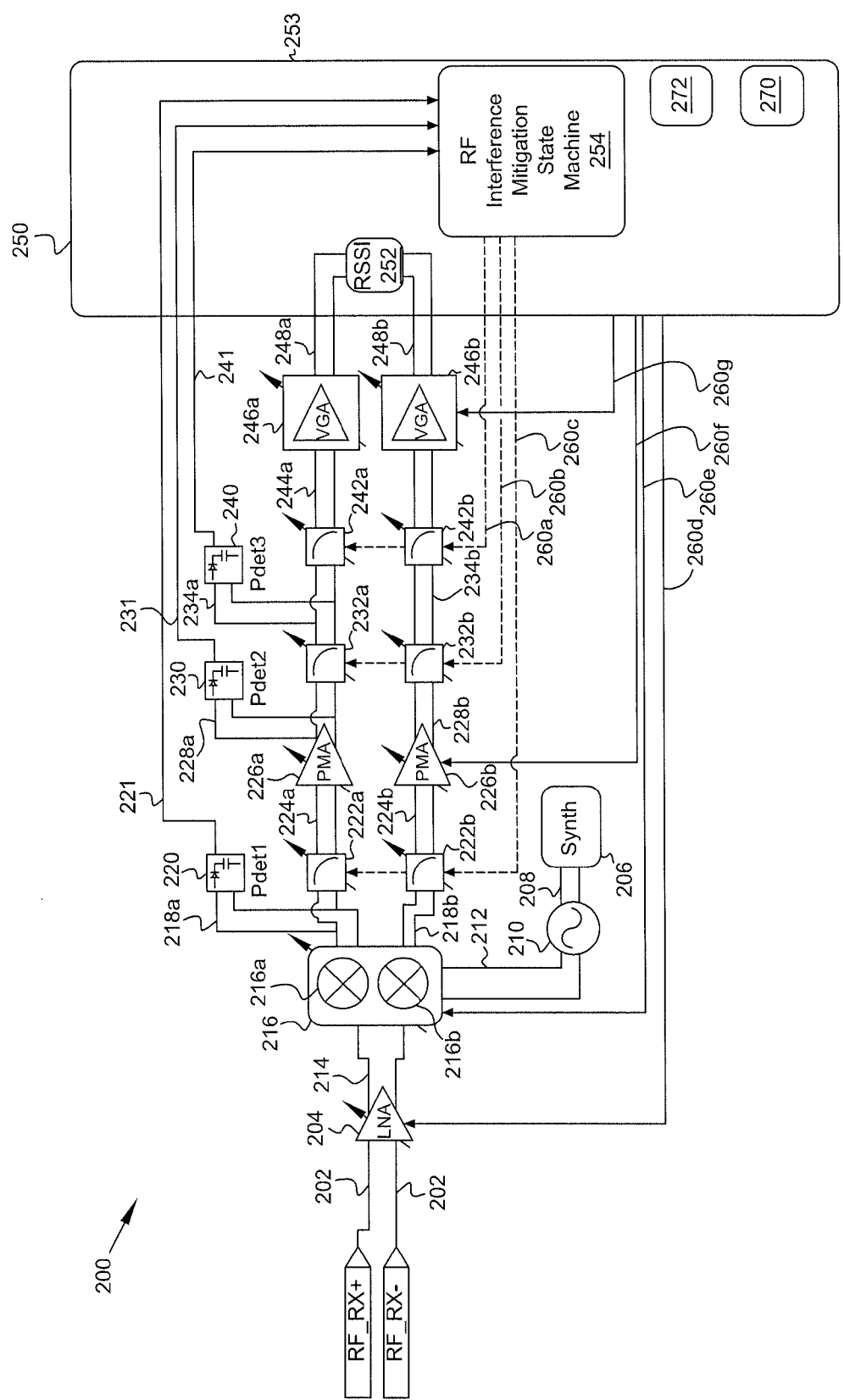
FIG. 2 is a block diagram of a system architecture in accordance with some embodiments of the present disclosure.

FIG. 2 is a block diagram of a system architecture of a receiver 200 in accordance with some embodiments of the present disclosure. An input signal 202 is received, e.g., from an antenna. The input signal is shown in differential form (RF_RX+ and RF_RX−); other signals in FIG. 2 may be in differential form but are not labeled as such, for visual clarity and to reduce clutter. The input signal is amplified by a low noise amplifier (LNA) 204 to provide an amplified input signal 214. A local oscillator 210 generates one or more oscillator signals 212 (e.g., sinusoids) based on control signals 208 from a synthesizer 206. A mixer 216 mixes the amplified input signal 214 with the oscillator signal 212. The mixer may include 216a and 216b, one of which may process an in-phase component and one of which may process a quadrature component. Separate processing pathways are shown in FIG. 2 for the in-phase and quadrature components (with similar reference characters but different suffixes, "a" or "b"), but the processing is similar for each, so the discussion below focuses on the top pathway in FIG. 2, which may be an in-phase or quadrature path. It is to be understood that the various feedback effects from state machine 254 to components such as filters and amplifiers may apply to components in either the in-phase or quadrature path or using both.

Mixed signal 218a provided by mixer 216 is processed by a series of filters 222a, 232a, 242a, which may be baseband filters. These filters implement the overall interference rejection of the baseband, and they may have programmable bandwidths with many different settings. For example, a multi-mode receiver may have bandwidths from 100 kHz up to 10 MHz to support the various modes like Global System for Mobile communications (GSM), Time Division-Synchronous Code Division Multiple Access (TD-SCDMA), Wideband Code Division Multiple Access (WCDMA), Long Term Evolution (LTE), LTE-Advanced, and other communication standards as is known in the art. Also, the filters provide progressively more rejection as one moves further toward the output (toward the right side of FIG. 2). The architecture also uses estimation circuits 220, 230, 240 connected to the baseband outputs of the various stages as shown (labeled Pdet1, Pdet2, and Pdet3 for convenience). Estimation circuits 220, 230, 240 may measure (estimate) power, e.g., by measuring voltage and computing power therefrom (because power and voltage are directly related), and are referred to herein as power estimation circuits. These power estimation circuits may be connected to either or both the in-phase and quadrature paths of the receiver. Also, these power estimation circuits may be implemented as any kind of detector, e.g. a peak detector, power detector, or any other kind of power estimation circuit as understood by one of ordinary skill in the art. Gain adjustment may be provided by a post-mixer amplifier (PMA) 226a and variable gain amplifier (VGA) 246a.

Thus, mixed signal 218 is filtered by filter 222a to provide signal 224a, which is amplified to provide signal 228a. The amplified signal 228a is filtered to provide signal 234a and then filtered to provide signal 244a, which is amplified to provide signal 248a. A logic module 250 includes a received signal strength indication (RSSI) module 252, which measures power and provides an output 253 to an RF interference mitigation state machine 254. RSSI 252 is described further below. State machine 254 receives inputs from power estimation circuits 220, 230, 240 and from RSSI 252, and provides feedback to LNA 204, PMA 226b, and VGA 246. State machine 254 also may provide signals to the filters 222, 232, and/or 242 to enable one or more of the filters to be enabled as discussed further below. Logic module 250 may be coupled to a transmitter (not shown), which may provide a signal to an antenna for transmission.

Figure 3:
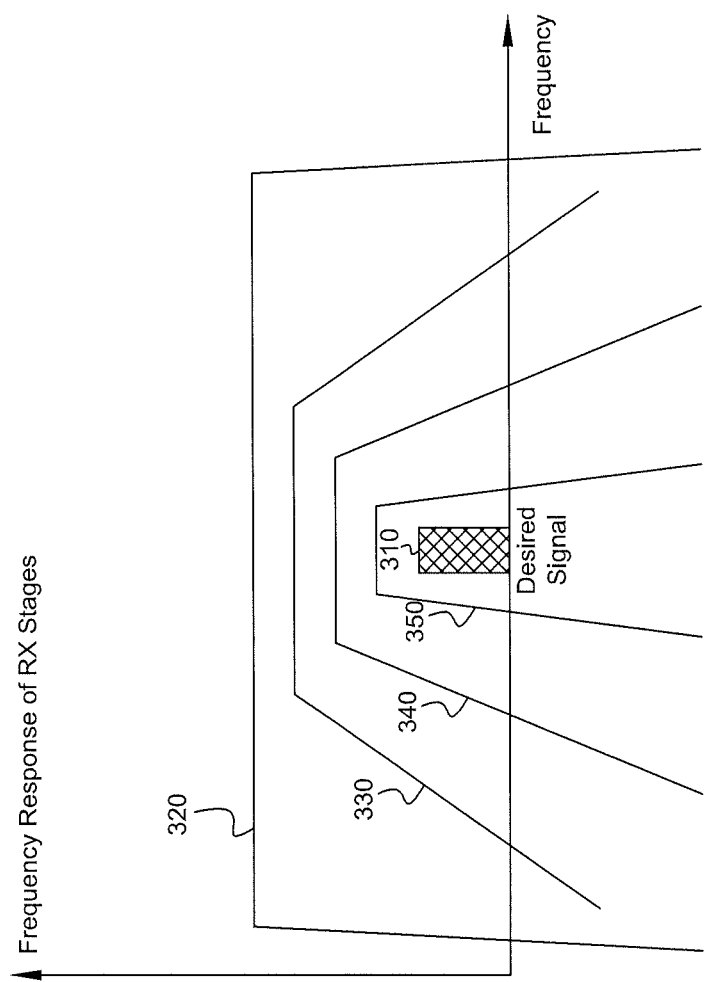
FIG. 3 is a depiction of selectivity to various filter outputs in accordance with some embodiments.

Filters 222a, 232a, and 242a may provide progressively more rejection, as illustrated in FIG. 3. FIG. 3 shows that the various power estimation circuits 220, 230, 240 will respond differently depending on the frequency offset of any interference. For example, an interference signal far removed from the desired signal 310 in frequency will result in a large detected power in Pdet1, but not in Pdet2 and Pdet3, due to the baseband filtering. The term "desired signal" refers to the signal transmitted by the transmitter and which, ideally, the receiver decodes. An adjacent channel signal will result in similar detected power readings in all three power estimation circuits 220, 230, 240. Frequency responses 320, 330, 340, and 350 in FIG. 3 may correspond to an output of mixer 216, an output of filter 222a, an output of filter 232a, and an output of filter 242a, respectively.

State machine 254, which may be a digital state machine that may be implemented in various ways, controls circuitry in receiver 200 to perform power estimation and RSSI measurements, determine the optimum configuration for the RF circuits, and provide feedback accordingly. Such feedback may includes setting of the bandwidth of the various filters, possibly bypassing certain filter stages if not needed, and/or modifying the gain and bias of the amplifier and/or mixer stages.

Figure 4A:
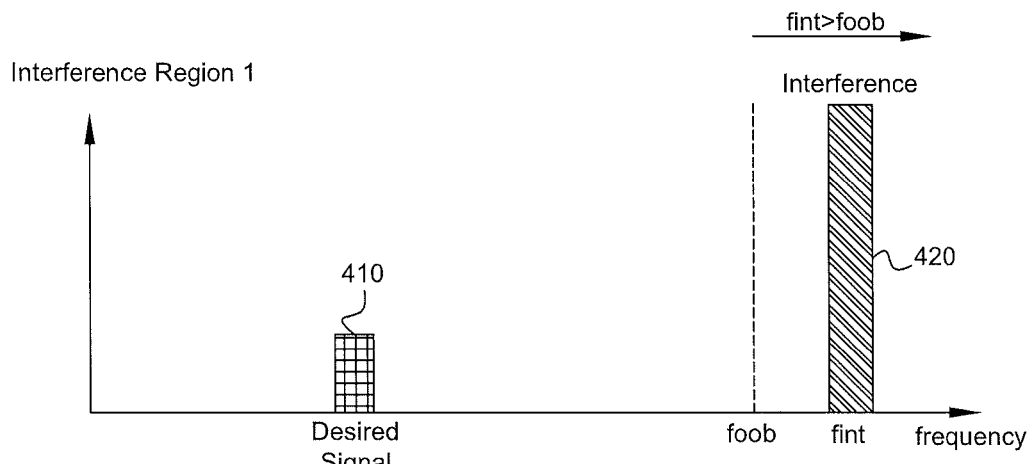
FIG. 4A-C are depictions of various interference scenarios in accordance with some embodiments.
Figure 4B:
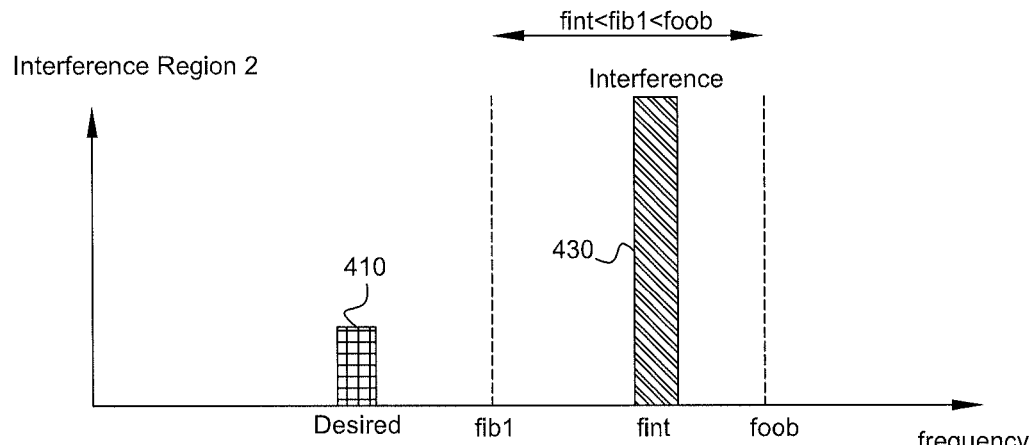
Figure 4C:
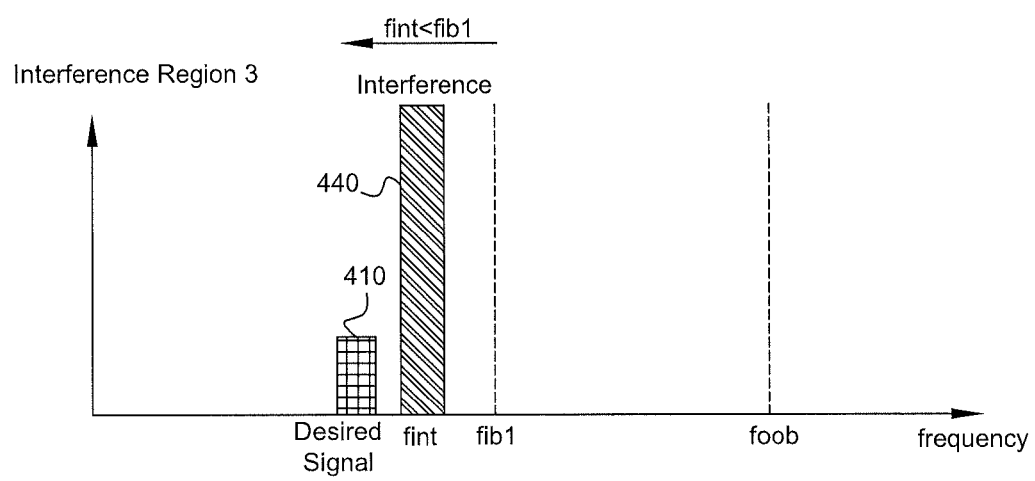

FIGS. 4A-C illustrate three different interference scenarios. Scenario 1, shown in FIG. 4A, is an out of band interference case where the frequency of interference signal 420 (fint) is relatively far away (out of band, denoted as foob) from the desired signal 410, i.e., fint>foob. Scenario 2, shown in FIG. 4B, is an intermediate interference case where the interference 430 is contained in a region below (lower in frequency than) the out of band region but not in the adjacent channel, i.e., fib1<fint<foob, where fib1 denotes an in-band limit. Scenario 3, shown in FIG. 4C, is an adjacent channel and/or proximate narrowband interference case. Interference 440 is at a lower frequency than fib1 in this case. For each scenario, the power estimation circuits 220, 230, 240 in FIG. 2 will respond differently, as described in the various cases listed in Table 1 below. In Table 1, BBF1, BBF2, and BBF3 refer to filters 222a, 232a, and 242a, respectively (or filters 222b, 232b, and 242b, respectively, if the lower processing path in FIG. 2 is applicable).

State machine 254 directs power estimators 220, 230, 240 to perform power estimation measurements, and based on the measurements, employs logic according to the relevant case. The thresholds threshold1, threshold2, and threshold3 may be predetermined and form the basis for comparisons as shown in Table 1.

By employing progressively narrower filters and comparing power measurements at one stage relative to another in a differential manner, embodiments of the present disclosure identify the region of interference and may intelligently take action accordingly (through state machine 254) to mitigate such interference. Such processing is dynamic, enabling efficient adaptation to various interference conditions, and is not pre-wired like prior art approaches that may degrade performance unnecessarily due to flawed assumptions about interference.

For these five different cases, the radio circuits may be configured optimally in a manner that varies from nominal operation as follows. Nominal operation may include enabling all three baseband filters 222a, 232a, 242a (or filters 222b, 232b, 242b for the lower processing path of FIG. 2), and employing predetermined gain settings that maximize the receiver's signal to noise ratio (SNR). In the discussion below of the various cases, only components in the upper processing path of FIG. 2, with suffix "a" (e.g., filter 222a) are discussed for brevity, but it is understood that the corresponding component(s) in the lower processing path (with suffix "b") are applicable if the lower processing path is used.

In case 1, state machine 254 may send feedback that results in bypassing filters 242a and/or 232a. A bias current of LNA 204 and/or of mixer 216 may be increased, or a gain of LNA 204 and/or of mixer 216 may be decreased, or both the bias current may be increased and the gain decreased, to improve the linearity of the RF stages.

In case 2, filter 242a may be bypassed or disabled when the power measured at power estimation circuit 240 is less than a predetermined threshold. Gain of PMA 226a may be decreased to improve linearity of the receiver.

In case 3 filter 242a may be bypassed or disabled when the power measured at power estimation circuit 240 is less than a predetermined threshold. Gain of LNA 204 and/or of mixer 216 may be decreased to improve the linearity of the receiver.

TABLE 1

Cases for different regimes based on power measurements

| Case | Interference Region | Pdet1 measurement | Pdet2 measurement | Pdet3 measurement | State Machine Action |
|---|---|---|---|---|---|
| Case 1 | 1 | Pdet1 > threshold1 | Pdet2 < threshold2 | Pdet3 < threshold3 | LNA or Mixer Bias Increase and/or LNA and/or Mixer gain decrease BBF2 and/or BBF3 may be bypassed |
| Case 2 | 2 | Pdet1 < threshold1 | Pdet2 > threshold2 | Pdet3 < threshold3 | BBF3 may be bypassed |
| Case 3 | 2 | Pdet1 > threshold1 | Pdet2 > threshold2 | Pdet3 < threshold3 | LNA and/or Mixer gain decrease BBF3 may be bypassed |
| Case 4 | 3 | Pdet1 < threshold1 | Pdet2 > threshold2 | Pdet3 > threshold3 | PMA gain decreased All filters enabled |
| Case 5 | 3 | Pdet1 > threshold1 | Pdet2 > threshold2 | Pdet3 > threshold3 | LNA and/or Mixer gain decrease All filters enabled |

In case 4, all three baseband filters 222a, 232a, 242a may be enabled. Gain of PMA 226a may be decreased to improve linearity of the receiver.

In case 5, all three baseband filters 222a, 232a, 242a may be enabled. Gain of LNA 204 and/or of mixer 216 may be decreased to improve linearity of the receiver.

State machine 254 may send signals 260a, 260b, 260c instructing the use of various numbers of filters as specified in the cases above.

In some embodiments, periodically, after the operation of the receiver is modified, the power estimation readings for the nominal operation case may be rechecked to determine the new optimal configuration. Thus, this architecture allows the optimal operation to change dynamically with changing interference conditions. The periodicity may be constrained by certain factors. On the minimum side, the minimum periodicity may be determined by the ability of the power estimation circuits to perform actual measurements (e.g., 10 μsec to hundreds of μsec) and the typical slot size for cellular communication systems. Several parameters such as gain are often held constant during a slot to ensure good quality signal without excessive transients during the slot. Based on these two constraints, the minimum periodicity of the state change may be on the order of a slot length or approximately 500-700 μsec. On the maximum side, the periodicity might be dictated by the slowest expected variation of signal conditions for a device such as a cellular phone. This can be calculated from the Doppler shift due to a 2 GHz carrier travelling at pedestrian speeds of, e.g., 3 km/hr to be about 100 msec. Therefore, on the high end the periodicity may be approximately 100 msec.

One factor that may determine the periodicity of the operation is a channel quality metric such as signal to noise ratio (SNR) estimation or block level error rate (BLER). Channel quality metrics such as SNR estimation and block level error rate may be calculated at a channel quality estimator 272 in logic module 250. These metrics are estimated using the techniques applicable in a typical cellular standard, as is understood by one of ordinary skill in the art. A typical approach for calculating block error rate is to perform cyclic redundancy checks on blocks of bits and calculating a running total of the ratio of blocks that fail this check to the total number of blocks received. These metrics may be measured continually at channel quality estimator 272 and may indicate whether the signal conditions are poor, which may indicate that interference is present and thus should be evaluated more frequently. Thus, in some embodiments, operation proceeds with the lowest rate until a quality metric exceeds a predetermined threshold. When this happens, the updates may become more frequent based on logic and control at a rate update logic module 270 of logic module 250. A number of thresholds may be predetermined that set operation in, e.g., a high update rate, medium update rate, and slow update rate depending on the signal conditions.

Example Filter Parameters

The baseband filter stages may be implemented in various ways to provide progressively narrower bandwidths. For example, filter 222a may be implemented as a 1 pole filter, filter 232a may be implemented as a 4 pole/2 zero filter, and filter 242a may be implemented as a 2 pole/2 zero filter.

A number of different interference regions, e.g., three interference regions, may be the basis for operation in different modes. A breakdown of interference regions may be as follows. Interference region 3 may correspond to any signal that is more than eight times the channel bandwidth away in frequency from a desired signal. Interference region 2 may correspond to any signal that is between around two times the channel bandwidth and eight times the channel bandwidth away in frequency. Interference region 1 may correspond to any signal around one times the channel bandwidth away in frequency, i.e., the adjacent channel. This breakdown results in the following interference regions shown in Table 2 for different common communications standards.

TABLE 2

Interference regions for various communications standards

| Standard | Channel BW | Interference Region 1 | Interference Region 2 | Interference Region 3 |
|---|---|---|---|---|
| GSM/Edge | 200 kHz | 200 kHz offset | 400 kHz to 1.6 MHz | >1.6 MHz |
| TD-SCDMA | 1.6 MHz | 1.6 MHz offset | 3.2 MHz to 12.8 MHz | >12.8 MHz |
| LTE (3 MHz) | 3 MHz | 3 MHz offset | 6 MHz to 24 MHz | >24 MHz |
| WCDMA | 5 MHz | 5 MHz offset | 10 MHz to 40 MHz | >40 MHz |
| LTE (5 MHz) | 5 MHz | 5 MHz offset | 10 MHz to 40 MHz | >40 MHz |

The filters 222a, 232a, 242a may be described in terms of the amount of rejection in the three interference regions. Some exemplary numbers for the rejection for each filter are shown in Table 3.

TABLE 3

Rejection for various filters

| Filter | Interference Region 1 | Interference Region 2 | Interference Region 3 |
|---|---|---|---|
| Filter 222a | 8 dB | 20 dB | 25 dB |
| Filter 232a | 20 dB | 50 dB | 70 dB |
| Filter 242a | 20 dB | 30 dB | 50 dB |

As an example, suppose it is desired to detect interference of >−30 dBm. Then, power estimation thresholds for the power estimation circuits may be set as follows: threshold for Pdet1=−35 dBm, threshold for Pdet2=−52 dBm, and threshold for Pdet3=−70 dBm. The "Yes" and "No" designations below (determined by state machine 254) in Tables 4-6 indicate whether the corresponding suggested threshold is exceeded for the particular power estimation circuit.

TABLE 4

Example for signal in interference region 3 with power = −30 dBm

| Power measurement referenced to antenna | Logic related to threshold |
|---|---|
| Pdet1 = −30 dBm | >−35 dBm—Yes |
| Pdet2 ≤ −55 dBm | >−52 dBm—No |
| Pdet3 ≤ −125 dBm | >−70 dBm—No |

TABLE 5

Example for signal in interference region 2 with power = −30 dBm

| Power measurement referenced to antenna | Logic related to threshold |
|---|---|
| Pdet1 = −30 dBm | >−35 dBm—Yes |
| Pdet2 ≥−50 dBm | >−52 dBm—Yes |
| Pdet3 = −100 dBm | >−70 dBm—No |

TABLE 6

Example for signal in interference region 1 with power = −30 dBm

| Power measurement referenced to antenna | Logic related to threshold |
|---|---|
| Pdet1 = −30 dBm | >−35 dBm—Yes |
| Pdet2 ≥−38 dBm | >−52 dBm—Yes |
| Pdet3 = −58 dBm | >−70 dBm—Yes |

Thus, embodiments of the present disclosure may determine that an interference signal is present with >−35 dBm power and may identify which frequency region the interference inhabits. This is just one scenario and many other possible detection levels, methods, and offsets are possible.

State machine 254 may send signals 260d, 260e, 260f, 260g to adjust gain and/or bias of various system components as shown in FIG. 2. The receiver architecture may include an LNA, mixer, and local oscillator (LO) chain that drives the mixer as shown in FIG. 2. In a typical case, the linearity of the RF circuits may be evaluated using the 1 dB compression point metric. This metric indicates the point at which the circuits become compressed and therefore is the maximum interference level that can be allowed for good quality reception. The 1 dB compression point may be determined either by the biasing of the transistors used in the LNA and mixer or by the amount of bias used in the LO chain depending on the architecture of the circuits. In a typical case, the 1 dB compression point may be adjusted to be around −30 dBm in order to save current. If interference is detected to be >−30 dBm, then a typical change in bias current of 5-10 mA may provide a 10 dB increase in 1 dB compression point to be >−20 dBm.

Alternatively, a gain change may be implemented to achieve the increase in the 1 dB compression point. For example, if the circuits are operated in a low bias condition with a 1 dB compression point around −30 dBm, then a 10 dB reduction in gain may increase the compression point to >−20 dBm. Thus, some embodiments may include a 5-10 dB gain change that increases the 1 dB compression point of the RF circuits by the equivalent 5-10 dB. A gain change combined with a bias change may provide an increase in 1 dB compression point of between 15 and 20 dB.

A factor that may determine whether to improve the linearity with a gain and/or bias change is the received signal strength indication (RSSI) provided by RSSI module 252. The improvement in linearity using a gain change also degrades the signal to noise performance since the noise figure of the RF circuits is increased. Because of this, some embodiments may use an RSSI threshold to determine at what point a gain change is to be used. In some embodiments, this RSSI threshold sets a level that must be exceeded before a gain change will be used to improve the linearity. In general, however, since the gain change method uses reduced bias and therefore less current drain, if the RSSI threshold is exceeded, a gain change is used rather than a bias change.

Figure 5:
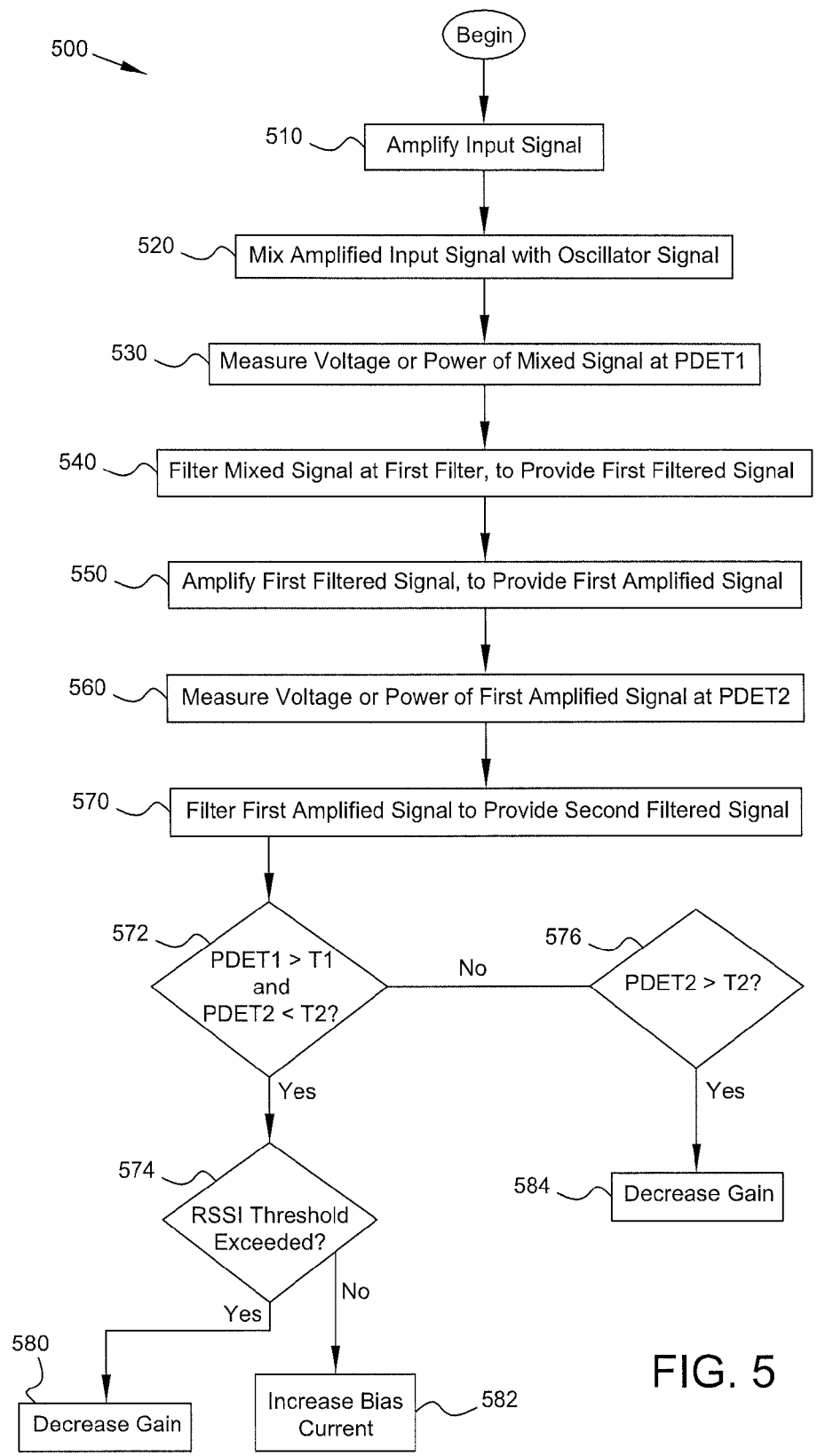
FIG. 5 is a flow diagram of a process in accordance with some embodiments.

FIG. 5 is a flow diagram of a process 500 in accordance with some embodiments. After process 500 begins, an input signal (e.g., signal 202) is amplified (block 510), to provide an amplified input signal (e.g., signal 214), which is mixed (block 520) with an oscillator signal (e.g., signal 212), to provide a mixed signal (e.g., signal 218a). The voltage or power of the mixed signal is measured (block 530), e.g., at Pdet1 shown in FIG. 2. The mixed signal is filtered (block 540), at a first filter, to pass a first band of frequencies, to provide a first filtered signal (e.g., signal 224a), which is amplified (block 550) to provide a first amplified signal (e.g., signal 228a). The voltage or power of the first amplified signal is measured (block 560), e.g., at Pdet2 shown in FIG. 2. The first amplified signal is filtered (block 570), at a second filter, to pass a second band of frequencies narrower than the first band, to provide a second filtered signal (e.g., signal 234a). If the measurement at Pdet1 is greater than a predetermined threshold T1 and the measurement at Pdet2 is less than a predetermined threshold T2 (comparison 572), then a gain used for the amplifying the input signal, or for the mixing, or for both, may be decreased, or a bias current used for the amplifying the input signal, or for the mixing, or for both, may be increased. Based on an RSSI measurement, which may be computed at RSSI module 252 in FIG. 2, and a comparison with an RSSI threshold (comparison 574), gain may be decreased or bias current may be increased as shown in FIG. 5 (blocks 580, 582). If the measurement at Pdet2 is greater than the predetermined threshold T2 (comparison 576), then a gain used for at least one of the amplifying the first filtered signal, the amplifying the input signal, and the mixing may be decreased (block 584).

State machine 254 may provide feedback via signal 260a to vary the gain of VGA 246a. The gain change may offset any gain changes in the LNA 204, mixer 216, and/or PMA 226b. A gain change in the VGA 246a will generally not improve the linearity of the receiver with interference since this VGA stage is after all the filter stages. However, if the gain of the LNA, mixer, and/or PMA is changed in order to improve the linearity, the gain of the VGA may be adjusted to compensate for the reduction of gain in those stages.

Figure 7:
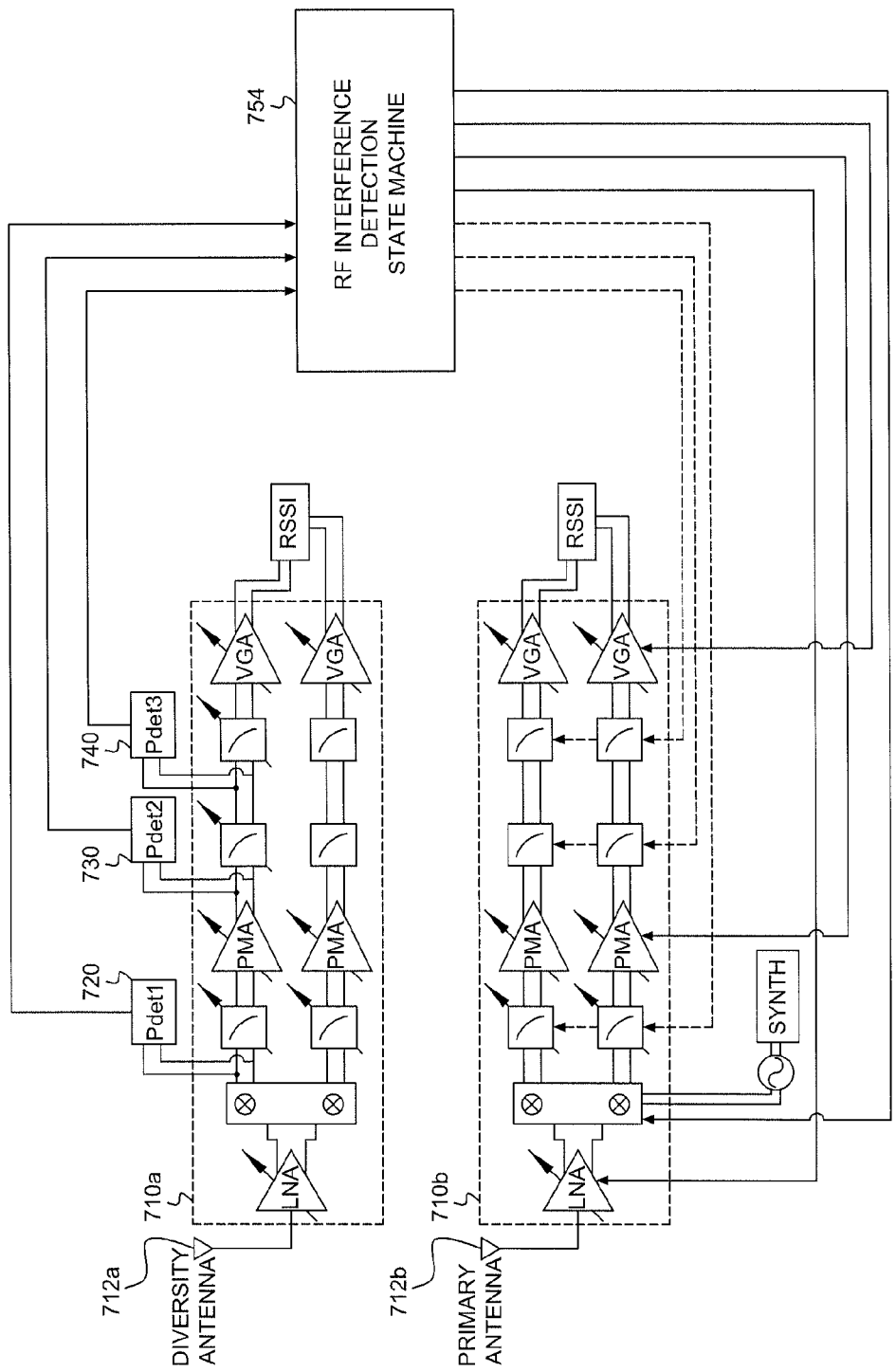
FIG. 7 is a block diagram of a multiple input multiple output (MIMO) receiver architecture in accordance with some embodiments.

The receiver architecture of FIG. 2 may also be implemented efficiently for a MIMO (multiple input multiple output) system as shown in FIG. 7. Because of the MIMO requirements for 3G and 4G cellular systems, a diversity receiver is often included in the RF and baseband architecture. This additional receiver is not needed for GSM/Edge mode and therefore may be used to perform the power estimation functionality shown in FIG. 2. Based on this information and other factors described above (e.g., regarding various cases and interference regions), the mode of the receiver(s) may be optimally configured based on the determined interference level and/or the frequency of the interference.

Figure 6:
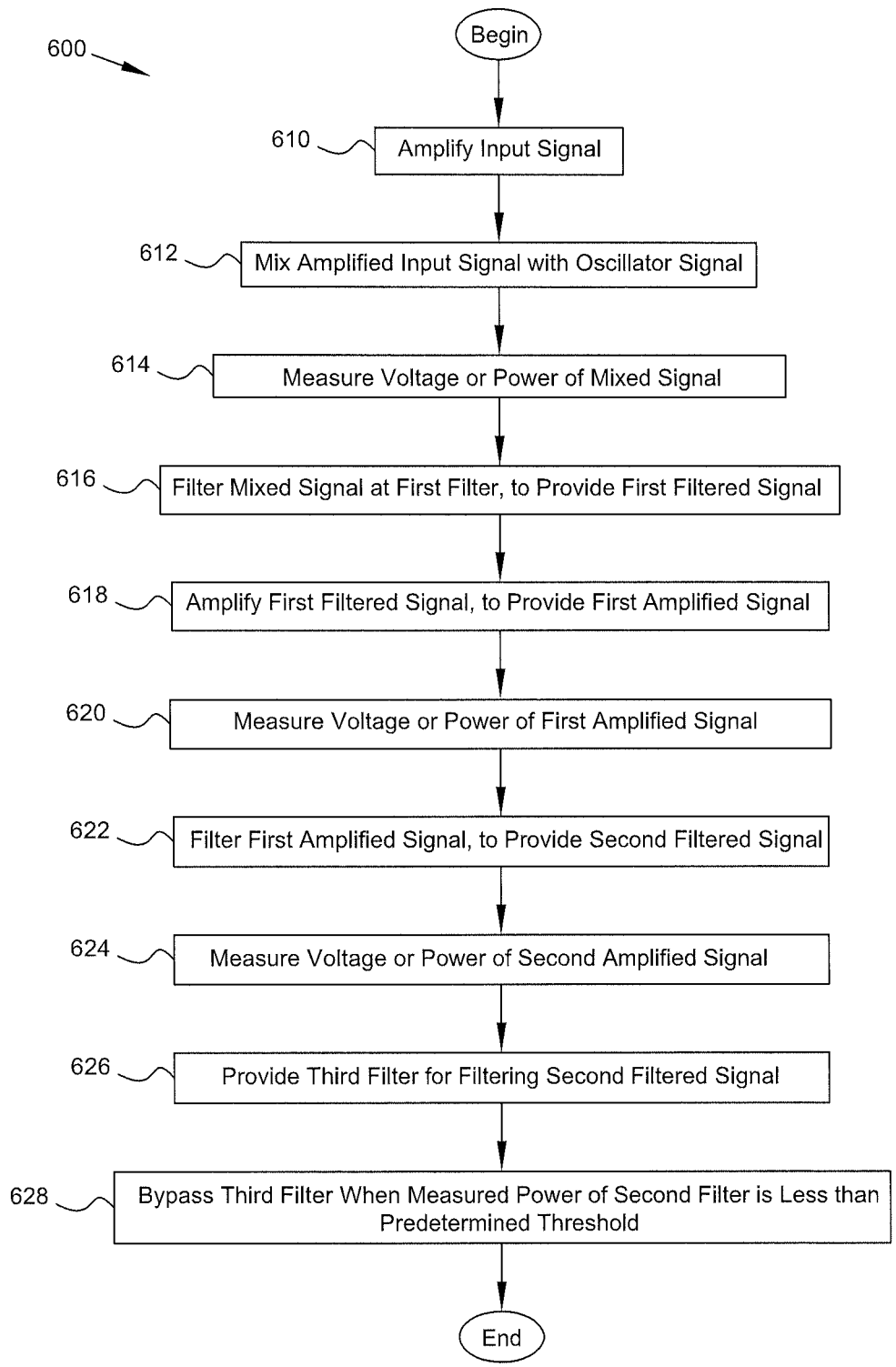
FIG. 6 is a flow diagram of a process in accordance with some embodiments.

FIG. 6 is a flow diagram of a process 600 in accordance with some embodiments. After process 600 begins, an input signal (e.g., signal 202) is amplified (block 610), to provide an amplified input signal (e.g., signal 214), which is mixed (block 612) with an oscillator signal (e.g., signal 212), to provide a mixed signal (e.g., signal 218a). The voltage or power of the mixed signal is measured (block 614), e.g., at Pdet1 shown in FIG. 2. The mixed signal is filtered (block 616), at a first filter (e.g., filter 222a), to pass a first band of frequencies, to provide a first filtered signal (e.g., signal 224a), which is amplified (block 618) to provide a first amplified signal (e.g., signal 228a). The voltage or power of the first amplified signal is measured (block 620), e.g., at Pdet2 shown in FIG. 2. The first amplified signal is filtered (block 622), at a second filter (e.g., filter 232a), to pass a second band of frequencies narrower than the first band, to provide a second filtered signal (e.g., signal 234a). The voltage or power of the second filtered signal is measured (block 624). A third filter (e.g., filter 242a) is provided (block 626) to filter the second filtered signal, to pass a third band of frequencies narrower than the second band, and to provide a third filtered signal. If the measured power of the second filtered signal is less than a predetermined threshold, then the third filter is bypassed (block 628). In other words, the third filter is disabled when a predetermined condition is met (when the measured voltage or power of the second filtered signal is less than a predetermined threshold).

FIG. 7 shows a receiver module 710b, which may receive an input from a primary receive antenna 712b, and a receiver module 710a, which may receive an input from a diversity antenna 712a. Processing in each of the receiver modules is similar to processing discussed above in the context of FIG. 2, and only certain differences from FIG. 2 are discussed below. The diversity receiver module 710a may be used for power estimation at power estimation circuits 720 (labeled Pdet1), 730 (Pdet2), 740 (Pdet3). State machine 754 may provide feedback signals as shown in FIG. 7, to control the use of filters, gain, and/or bias currents in a manner similar to that described above.

The use of the diversity receiver in some embodiments to perform interference estimation in parallel provides several advantages. One advantage is that the diversity receiver can be adjusted to any bandwidth option that is desired at any time in order to detect interference. The primary receiver is tasked with receiving the desired signal and therefore the baseband filters have limited bandwidth during the desired reception slot to limit noise and interference. The diversity receiver, when used for interference detection, has no such limitation, so the bandwidth can be increased as desired. Another advantage is that the diversity receiver gain may be adjusted for the best performance to check the interference without considering the desired signal. The primary receiver must receive the desired signal and therefore the gain control is set to optimize the level of that signal. The diversity receiver, when used for interference detection, is again not constrained by the need to receive the desired signal, and therefore the gain may be optimized to detect interference.

Although examples are illustrated and described herein, embodiments are nevertheless not limited to the details shown, since various modifications and structural changes may be made therein by those of ordinary skill within the scope and range of equivalents of the claims.

What is claimed is:

1. A method comprising:
    amplifying an input signal to provide an amplified input signal;
    mixing the amplified input signal with an oscillator signal, to provide a mixed signal;
    measuring voltage or power of the mixed signal;
    filtering the mixed signal, at a first filter, to pass a first band of frequencies, to provide a first filtered signal;
    amplifying the first filtered signal, to provide a first amplified signal;
    measuring voltage or power of the first amplified signal;
    filtering the first amplified signal, at a second filter, to pass a second band of frequencies narrower than the first band, to provide a second filtered signal;
    decreasing a gain used for at least one of the amplifying the input signal and the mixing, when the measured voltage or power of the mixed signal is greater than a first predetermined threshold and the measured voltage or power of the first amplified signal is less than a second predetermined threshold; and
    decreasing a gain used for at least one of the amplifying the first filtered signal, the amplifying the input signal, and the mixing, when the measured voltage or power of the first amplified signal is greater than the second predetermined threshold.

2. The method of claim 1, wherein decreasing the gain used for at least one of the amplifying the first filtered signal, the amplifying the input signal, and the mixing comprises decreasing the gain used for amplifying the first filtered signal, when the measured voltage or power of the mixed signal is less than the first predetermined threshold and the measured voltage or power of the first amplified signal is greater than the second predetermined threshold.

3. The method of claim 1, wherein decreasing the gain used for at least one of the amplifying the first filtered signal, the amplifying the input signal, and the mixing comprises decreasing the gain used for at least one of the amplifying the input signal and the mixing, when the measured voltage or power of the mixed signal is greater than the first predetermined threshold and the measured voltage or power of the first amplified signal is greater than the second predetermined threshold.

4. The method of claim 1, further including:
    measuring voltage or power of the second filtered signal;
    providing a third filter to filter the second filtered signal, to pass a third band of frequencies narrower than the second band, and to provide a third filtered signal; and
    bypassing the third filter when the measured voltage or power of the second filtered signal is less than a third predetermined threshold.

5. The method of claim 1, further including:
    measuring voltage or power of the second filtered signal; and
    filtering the second filtered signal to pass a third band of frequencies narrower than the second band, to provide a third filtered signal;
    wherein decreasing the gain used for at least one of the amplifying the first filtered signal, the amplifying the input signal, and the mixing comprises decreasing the gain used for amplifying the first filtered signal, when the measured voltage or power of the mixed signal is less than the first predetermined threshold and the measured voltage or power of the second filtered signal is greater than a third predetermined threshold.

6. The method of claim 5, further including:
    amplifying the third filtered signal to provide a second amplified signal;
    measuring voltage or power of the second amplified signal; and
    determining whether the measured voltage or power of the second amplified signal exceeds a predetermined received signal strength indication (RSSI) threshold;
    wherein the decreasing the gain used for the at least one of the amplifying the input signal and the mixing is responsive to a determination that the measured voltage or power of the second amplified signal exceeds the predetermined RSSI threshold.

7. The method of claim 1, further including:
    measuring voltage or power of the second filtered signal; and
    filtering the second filtered signal to pass a third band of frequencies narrower than the second band, to provide a third filtered signal;
    wherein decreasing the gain used for at least one of the amplifying the first filtered signal, the amplifying the input signal, and the mixing comprises decreasing the gain used for at least one of the amplifying the input signal and the mixing, when the measured voltage or power of the mixed signal is greater than the first predetermined threshold and the measured voltage or power of the second filtered signal is greater than a third predetermined threshold.

8. The method of claim 7, further including:
amplifying the third filtered signal to provide a second amplified signal;
measuring voltage or power of the second amplified signal; and
determining whether the measured voltage or power of the second amplified signal exceeds a predetermined received signal strength indication (RSSI) threshold;
wherein the decreasing the gain used for the at least one of the amplifying the input signal and the mixing is responsive to a determination that the measured voltage or power of the second amplified signal exceeds the predetermined RSSI threshold.

9. A method comprising:
amplifying an input signal to provide an amplified input signal;
mixing the amplified input signal with an oscillator signal, to provide a mixed signal;
measuring voltage or power of the mixed signal;
filtering the mixed signal, at a first filter, to pass a first band of frequencies, to provide a first filtered signal;
amplifying the first filtered signal, to provide a first amplified signal;
measuring voltage or power of the first amplified signal;
filtering the first amplified signal, at a second filter, to pass a second band of frequencies narrower than the first band, to provide a second filtered signal;
decreasing a gain used for at least one of the amplifying the input signal and the mixing, when the measured voltage or power of the mixed signal and the measured voltage or power of the first amplified signal satisfy a predetermined condition;
measuring voltage or power of the second filtered signal;
providing a third filter to filter the second filtered signal, to pass a third band of frequencies narrower than the second band, and to provide a third filtered signal; and
bypassing the third filter when the measured voltage or power of the second filtered signal is less than a predetermined threshold.

10. The method of claim 9, wherein the predetermined condition is that the measured voltage or power of the mixed signal is greater than a first predetermined threshold and the measured voltage or power of the first amplified signal is less than a second predetermined threshold.

11. The method of claim 9, further including:
decreasing the gain used for amplifying the first filtered signal, when the measured voltage or power of the mixed signal is less than a first predetermined threshold and the measured voltage or power of the first amplified signal is greater than a second predetermined threshold.

12. The method of claim 9, further including:
decreasing the gain used for at least one of the amplifying the input signal and the mixing, when the measured voltage or power of the mixed signal is greater than a first predetermined threshold and the measured voltage or power of the first amplified signal is greater than a second predetermined threshold.

13. A method comprising:
amplifying an input signal to provide an amplified input signal;
mixing the amplified input signal with an oscillator signal, to provide a mixed signal;
measuring voltage or power of the mixed signal;
filtering the mixed signal, at a first filter, to pass a first band of frequencies, to provide a first filtered signal;
amplifying the first filtered signal, to provide a first amplified signal;
measuring voltage or power of the first amplified signal;
filtering the first amplified signal, at a second filter, to pass a second band of frequencies narrower than the first band, to provide a second filtered signal;
decreasing a gain used for at least one of the amplifying the first filtered signal, the amplifying the input signal, and the mixing, when the measured voltage or power of the first amplified signal satisfies a predetermined condition;
measuring voltage or power of the second filtered signal;
providing a third filter to filter the second filtered signal, to pass a third band of frequencies narrower than the second band, and to provide a third filtered signal; and
bypassing the third filter when the measured voltage or power of the second filtered signal is less than a predetermined threshold.

14. The method of claim 13, wherein the predetermined condition is that the measured voltage or power of the first amplified signal is greater than a second predetermined threshold.

15. The method of claim 13, further including:
decreasing a gain used for at least one of the amplifying the input signal and the mixing, when the measured voltage or power of the mixed signal is greater than a first predetermined threshold and the measured voltage or power of the first amplified signal is less than a second predetermined threshold.

16. The method of claim 13, wherein decreasing the gain used for at least one of the amplifying the first filtered signal, the amplifying the input signal, and the mixing comprises decreasing the gain used for amplifying the first filtered signal, when the measured voltage or power of the mixed signal is less than a first predetermined threshold and the measured voltage or power of the first amplified signal is greater than a second predetermined threshold.

17. The method of claim 13, wherein decreasing the gain used for at least one of the amplifying the first filtered signal, the amplifying the input signal, and the mixing comprises decreasing the gain used for at least one of the amplifying the input signal and the mixing, when the measured voltage or power of the mixed signal is greater than a first predetermined threshold and the measured voltage or power of the first amplified signal is greater than a second predetermined threshold.

* * * * *